(12) United States Patent
Simons

(10) Patent No.: US 8,890,633 B2
(45) Date of Patent: Nov. 18, 2014

(54) RESONANT CIRCUIT WITH AUTOMATED TRIMMING CAPABILITIES

(71) Applicant: NXP B.V., Eindhoven (NL)

(72) Inventor: Sven Simons, Gratkorn (AT)

(73) Assignee: NXP B.V., Eindhoven (NL)

( * ) Notice: Subject to any disclaimer, the term of this patent is extended or adjusted under 35 U.S.C. 154(b) by 98 days.

(21) Appl. No.: 13/719,011

(22) Filed: Dec. 18, 2012

(65) Prior Publication Data
US 2014/0167865 A1  Jun. 19, 2014

(51) Int. Cl.
| | |
|---|---|
| H03B 5/08 | (2006.01) |
| H03L 5/00 | (2006.01) |
| H03J 1/00 | (2006.01) |
| H03J 3/20 | (2006.01) |
| H03J 3/08 | (2006.01) |
| H03J 3/24 | (2006.01) |
| H03B 5/10 | (2006.01) |
| H03B 1/00 | (2006.01) |

(52) U.S. Cl.
CPC ... H03L 5/00 (2013.01); *H03J 3/08* (2013.01); *H03J 3/24* (2013.01); *H03B 5/10* (2013.01); *H03B 1/00* (2013.01); H03J 1/0008 (2013.01); *H03J 2200/28* (2013.01); H03J 3/20 (2013.01)
USPC .................. 331/167; 331/116 R; 331/116 FE; 331/177 V; 331/175; 455/340; 455/183.1

(58) Field of Classification Search
CPC ............. H03J 1/0008; H03J 3/08; H03J 3/24; H03B 3/00; H03B 5/10
USPC ............ 331/167, 116 R, 116 FE, 175, 177 V; 455/183.1, 340
See application file for complete search history.

(56) References Cited

U.S. PATENT DOCUMENTS

| | | | |
|---|---|---|---|
| 4,334,323 A | | 6/1982 | Moore |
| 4,736,456 A | | 4/1988 | Maier |
| 5,101,509 A | * | 3/1992 | Lai .............................. 455/183.1 |
| 5,280,638 A | | 1/1994 | Porambo et al. |
| 5,315,262 A | | 5/1994 | Schulz |
| 5,550,536 A | | 8/1996 | Flaxl |
| 5,982,228 A | * | 11/1999 | Khorramabadi et al. ..... 327/553 |

FOREIGN PATENT DOCUMENTS

| | | |
|---|---|---|
| DE | 3922977 C2 | 1/1991 |
| EP | 0407848 A2 | 1/1991 |
| GB | 2 427 088 A | 12/2006 |
| WO | 2006/106127 A1 | 10/2006 |
| WO | 2006/127106 A2 | 11/2006 |

OTHER PUBLICATIONS

Extended European Search Report for EP Patent Appln. No. 13197670.6 (Mar. 10, 2013).

* cited by examiner

*Primary Examiner* — Arnold Kinkead

(57) ABSTRACT

According to an example embodiment, a device includes a resonant circuit configured and arranged to provide a peak current flow at a resonance frequency. A trimming circuit provides variable impedances to the resonant circuit and thereby changes the resonance frequency for the resonant circuit. A driver circuit is configured to generate a trimming signal that oscillates at a desired frequency. A switch circuit couples and decouples the driver circuit to the resonant circuit for driving the resonant circuit with the trimming signal. An amplitude detection circuit detects amplitudes for signals generated in response to the trimming signal being connected to the resonant circuit. A processing circuit correlates detected amplitudes from the amplitude detection circuit with different impedance values of the variable trimming circuit.

18 Claims, 4 Drawing Sheets

RESONANT CIRCUIT WITH AUTOMATED TRIMMING CAPABILITIES

Aspects of the present disclosure relate to apparatuses, devices, and methods involving resonant circuitry that with self trimming capabilities.

Radio frequency (RF) communication devices are used in a variety of different applications and devices. RF devices include circuits designed to communicate by transmitting and receiving at one or more desired frequencies. Accordingly, these circuits are configured and arranged to generate oscillating signals at the desired frequencies and to use these signals to generate, decode and/or encode the transmitted RF signals. The oscillating signals can be derived from a signal created by a resonant circuit.

Resonant circuits can be designed upon the premise that at a particular frequency, electrical energy oscillates between the various components of the circuit. For instance, resonance can occur when electrical energy oscillates between components that have inductive and capacitive properties, respectively. Thus, resonant circuits can be built using an inductor connected in parallel to a capacitor (a parallel LC resonant circuit). The resonance occurs when the magnetic field of the inductor collapses and generates an electrical current. The electrical current then charges the capacitor, which subsequently discharges to build up the magnetic field of the inductor.

The effective impedance for both capacitive and inductive components varies as a function of their respective capacitance and inductance and the effective impedance of resonant circuits can be particularly low at a certain frequency, referred to as the resonant frequency. The impedance value affects the resonant circuit's response to signals of different frequencies and is a function of the inductance and capacitance of the circuit. The response of the resonance circuit to an input signal can therefore peak at the resonance frequency, at which the current flow resonates most strongly with the input signal. This property can be particular useful for tuning the RF communication device to a particular frequency. For instance, resonant circuits can be used as part of tuning circuits designed to receive broadcast signals of specific frequencies, while filtering out signals of other frequencies.

Because the resonance frequency is set by the values of the components of the circuit, variances in component values can result in corresponding variances in the resonant frequency. Variances in component values might be caused by manufacturing tolerances or changes in temperature. Moreover, resonant circuits can be designed to operate within a range of different potential desired resonant frequencies. Accordingly, aspects of the present disclosure are directed toward circuits and methods relating to adjusting (trimming) the operating parameters of resonant circuits to change the resonant frequency thereof.

Aspects of the present disclosure relate generally to apparatuses, devices, and methods relating to the applications herein. In one or more embodiments, a resonant circuit is configured to provide a mechanism to adjust, or trim, operational parameters of the resonant circuit that adjust the operating frequency of the resonant circuit.

According to an example embodiment, a device includes a resonant circuit configured and arranged to provide a peak current flow at a resonance frequency. A trimming circuit provides variable impedances to the resonant circuit and thereby changes the resonance frequency for the resonant circuit. A driver circuit generates a trimming signal that oscillates at a desired frequency. A switch circuit couples and decouples the driver circuit to the resonant circuit for driving the resonant circuit with the trimming signal. An amplitude detection circuit detects amplitudes for signals generated in response to the trimming signal being connected to the resonant circuit. A processing circuit correlates detected amplitudes from the amplitude detection circuit with different impedance values of the variable trimming circuit.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
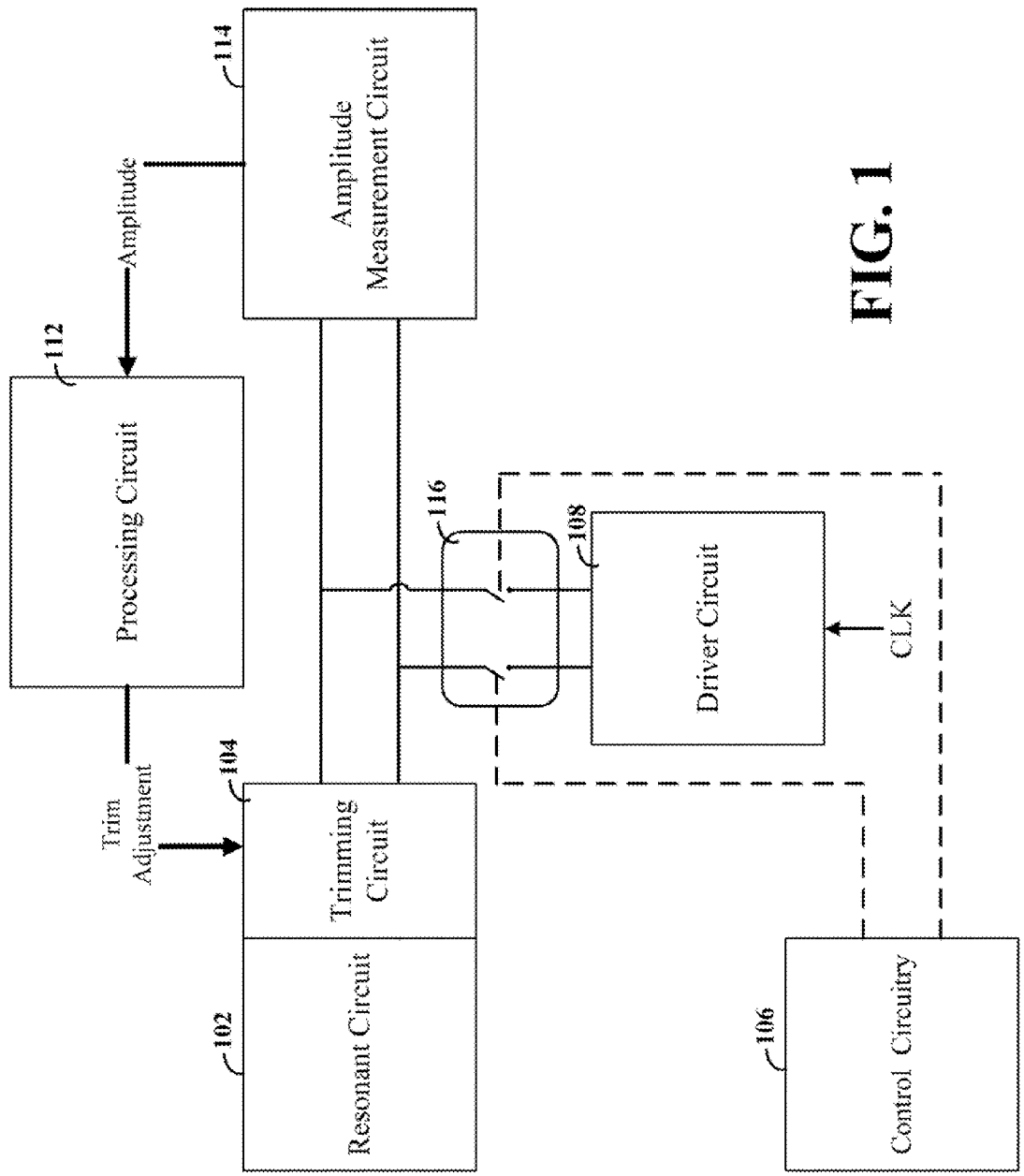
FIG. 1 shows a block diagram for a system providing trimming adjustment for a resonant circuit, consistent with embodiments of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving modifying the operating parameters of resonant circuits to achieve a desired resonant frequency. While not necessarily so limited, various aspects may be appreciated through a discussion of examples using this context.

Aspects of the present disclosure are directed toward automated adjustments to trimming values for resonant circuits in order to tune the resonant circuit to a desired resonant frequency. As explained in more detail herein, the automated adjustments can be carried out by generating a signal that oscillates at the desired frequency. This signal is then provided to the resonant circuit, which results in a corresponding oscillation output signal. A trimming circuit (e.g., a variable capacitor or variable inductor) provides variable impedance that can be adjusted to change the operating parameters and resonant frequency for the resonant circuit. By adjusting the impedance of the trimming circuit and measuring the corresponding outputs of the resonant circuit, a particular impedance value of the trimming circuit can be determined. One mechanism for measuring the outputs of the resonant circuit is to measure the amplitude of the output signal. The amplitude of the output signal is generally highest when the resonance frequency is equal to the frequency of the trimming signal.

Consistent with embodiments of the present disclosure, a switching circuit can be used to selectively connect and disconnect the trimming circuit (and the trimming signal) from the resonant circuit. For instance, the trimming circuit can be connected during a calibration mode and disconnected during normal operation. This can be particularly useful for limiting the effect of the trimming circuit on normal operation (e.g., undesired loading caused by connection of the trimming circuit).

Aspects of the present disclosure are directed toward the recognition that the impedance value of the trimming circuit at the peak amplitude detected during use of the driver circuit can be offset from the desired impedance (during normal operation). This offset can be caused by, among other things, the additional load of the driver circuit.

Certain embodiments of the present disclosure are directed toward a processing circuit that correlates the detected amplitudes of signal from the resonant circuit to the corresponding impedance values of the trimming circuit. This correlation can be used to select the appropriate setting for the trimming circuit. In certain instances, the processing circuit can interpolate the amplitude for the impedance values between actual measured amplitudes. For example, the trimming circuit could be adjusted in increments of 1 pF and corresponding amplitude measurements can be taken at this granularity. The processing circuit can interpolate intermediate amplitudes for points between the 1 pF increments (e.g., using a curve fitting algorithm or applying a predetermined algorithm). From this interpolation, the processing circuit can determine a more precise impedance value for the peak amplitude. This can be particularly useful for use with the offset adjustment, which might otherwise select a less than optimal impedance value.

Various example embodiments are directed to a device that includes a resonant circuit that provides a peak current flow at a resonance frequency. This resonance frequency is set according to the operating parameters of the resonant circuit and can be subject to variations (e.g., due to component manufacturing tolerances or temperature changes). A trimming circuit is connected to the resonant circuit in a manner that allows the trimming circuit to provide variable impedance that, when adjusted, changes the resonance frequency. A driver circuit is configured to generate a trimming signal that oscillates at a desired frequency. The desired frequency can be determined by an external signal (clock) source that is provided to the driver circuit. A switch circuit is configured to connect and disconnect the trimming signal of the driver circuit to the resonant circuit. An amplitude detection circuit is configured to detect amplitudes for signals generated in response to the trimming signal being connected to the resonant circuit. A processing circuit is configured to correlate detected amplitudes from the amplitude detection circuit with different impedance values of the variable trimming circuit.

Turning now to the figures, FIG. 1 shows a block diagram for a system providing trimming adjustment for a resonant circuit, consistent with embodiments of the present disclosure. Resonant circuit 102 can be configured to oscillate in response to an input signal. This oscillation can then be used by RF communication circuits. For instance, a received RF signal can be provided to the resonant circuit to filter and detect an RF communication signal from background noise. The resonant frequency of the resonant circuit 102 determines the effectiveness of the resonant circuit 102 for use with a corresponding frequency for the RF communication signal. Thus, mismatches between the resonance frequency and the frequency of the RF communication signal can degrade the effectiveness of the communication device.

Trimming circuit 104 includes a variable impedance (capacitive or inductive) element that when varied results in a change to the resonance frequency of the resonant circuit 102. In certain embodiments, the trimming circuit 104 can be a discrete switched/tunable capacitor circuit. The impedance value for the trimming circuit 104 can then be controlled using a digital control (trim adjustment) signal, which controls a plurality of digitally controlled tuning capacitor elements.

Driver circuit 108 can produce a trimming signal that oscillates at a desired frequency. This frequency can be set in response to a received signal that also oscillates at the desired frequency. For instance, the driver circuit 108 can receive a clock signal (CLK) generated by an external crystal oscillator. In certain embodiments, the driver circuit 108 can receive the clock signal as a square wave. This can be particularly useful for allowing the use of an external crystal oscillator that is designed for generating a clock signal with a precise frequency.

Consistent with certain embodiments, the device can be configured to provide automated trimming functions that are substantially independent of the drive strength of the driver circuit 108. This is based upon the recognition that the amplitude detection and corresponding selection of an impedance value for the trimming circuit 104 is based upon the relative drive strength of the driver circuit. Thus, the input drive strength of the driver circuit is substantially independent from the ability to determine the desired impedance value (e.g., assuming that the drive strength is within an acceptable operating range for the circuits and also remains relatively constant). This can be particularly useful for allowing the device to be used with a variety of different external voltage supply levels and clock generation circuits.

Switching circuit 116 can be configured to control whether or not driver circuit 108 is connected to the trimming circuit 104. The connection state of switching circuit 116 can be controlled by a control circuit 106. For instance, control circuit 106 can be configured and arranged to provide control signals that enable or disable switches (e.g., transistors) located between the driver circuit 108 and the resonant circuit 102. The control circuit 106 can be designed to enable switches that connect the driver circuit during one or more calibration modes and to disable the switches during normal operation. For instance, a calibration can occur during the initial startup or use of the device, whether during manufacturing or by an end user. The calibration can also be carried out between communications. For instance, the control circuit 106 can be configured and arranged to connect the driver circuit 108 between communications. This can occur, for instance, after completion of a communication phase (e.g., in the absence of an RF carrier wave). This can be particularly useful when there is a known communication schedule or when there is a known delay between sequential communications. The calibration can be set to complete during such times.

Amplitude measurement circuit 114 is configured to determine the amplitude of the output from the resonant circuit 102. This can be done, for instance, using a peak detector circuit that generates an output signal, which is responsive to the peak (voltage) value of an applied alternating current (AC) signal. Particular embodiments of the present disclosure are directed toward the use of a peak detector circuit in demodulating a received RF communication. For instance, transmission protocols that use amplitude modulation can use a peak detector circuit (or more particularly an envelope detector circuit) to decode received signals. An analog to digital converter can generate a digital version of the detected peak value. Accordingly, aspects of the present disclosure are directed toward a device the uses a common peak detector circuit for both demodulation and trimming adjustment. Similarly, a common analog to digital converter (ADC) can be used for both demodulation and trimming adjustment.

Each of these components can be part of the amplitude measurement circuit 114, while also providing the demodulation functionality.

Processing circuit 112 can be configured to control and adjust the impedance value for the trimming circuit 104. For instance, processing circuit 112 can provide a signal with a particular voltage to trimming circuit 104 (e.g., where trimming circuit 104 includes a varactor). In certain embodiments, this voltage can be provided using a digital to analog circuit (DAC). The processing circuit 112 can also be configured to receive the detected peak amplitude information from the amplitude measurement circuit 114. By correlating the impedance setting for the trimming circuit 104 with the resulting detected peak amplitude from the amplitude measurement circuit 114, the processing circuit 112 can determine an appropriate impedance setting to use during normal operation of the resonant circuit 102.

Processing circuit 112 can use the correlated information to determine an impedance value that results in sufficient (or maximum) amplitude for the signal from the resonant circuit 102. The processing circuit 112 can then set the impedance value trimming circuit 104 to the determined impedance value. This causes the resonant frequency of the resonant circuit 102 to be set to (or sufficiently near) the frequency of the signal provided by the driver circuit 108. As discussed in more detail herein, the processing circuit 112 can make this determination using an offset to compensate for extra capacitance resulting from, for example, the connection of the driver circuit 108.

Consistent with certain embodiments, the processing circuit can perform a sequential sweep across the available impedance values for the trimming circuit and then receive and correlate corresponding amplitudes. In other embodiments, the sweep does not need to be sequential and can select values according to a predetermined pattern, randomly or otherwise. When sequentially obtained (e.g., low capacitance to high capacitance or vice versa) changes in the circuit condition can be more heavily skewed toward values on one end of the sequence. Accordingly, a non-sequential sweep can be useful for mitigating problems due to undesired changes to the circuit conditions (e.g., sudden temperature changes during the calibration/sweep or voltage changes for the input clock signal). Moreover, the sweep can have varying degrees of granularity. For instance, the sweep can include peak amplitude measurements at 0.1 Volt increments or at 0.2 Volt increments. Other embodiments allow for intelligent selection of impedance/measurement values. For instance, the processing circuit 112 can concurrently use the current detected peak amplitude to select the next impedance value at which the amplitude peak is detected. Certain embodiments therefore contemplate the possibility of using a variation of a hill climbing algorithm. Other iterative search algorithms are also possible to determine the impedance value that results in the maximum peak amplitude from the resonant circuit 102.

Processing circuit 112 can be configured to perform the test/calibration of the resonant circuit 102 and trimming circuit 104 in a variety of different situations. For instance, the calibration can be performed in response to power-up and/or initialization of the device. This allows for the determination of an initial value based upon the initial operating parameters. Aspects of the present disclosure, however, recognize that the operating parameter can change over time as the device continues to be used. For instance, the resonant circuit 102 could be used as part of a keyless entry system for an automobile. The resonant circuit 102 would therefore be subject to significant temperature changes, such as when an individual enters and leaves climate controlled areas. Accordingly, the processing circuit 112 can be configured to perform calibration of the resonant circuit 102 at times other than power-up and/or initialization of the device. For instance, processing circuit 112 can respond to a received RF communication by initiating a calibration. The subsequent demodulation of the RF communication can thereby benefit by the (additional) calibration. The processing circuit 112 can also be configured to periodically initiate a calibration.

Certain embodiments recognize that once an initial (coarse) calibration has been undertaken, it can be beneficial to limit the amount that impedance values can be adjusted during subsequent (fine) calibrations. For instance, each subsequent calibration can determine whether or not the impedance value should be adjusted up, down or not at all. The size of the adjustment can then be limited to a set value even though the determined impedance value might suggest a larger change. This can be particularly useful for mitigating problems resulting from temporary conditions (e.g., external noise that results in an improper peak amplitude reading).

Figure 2:
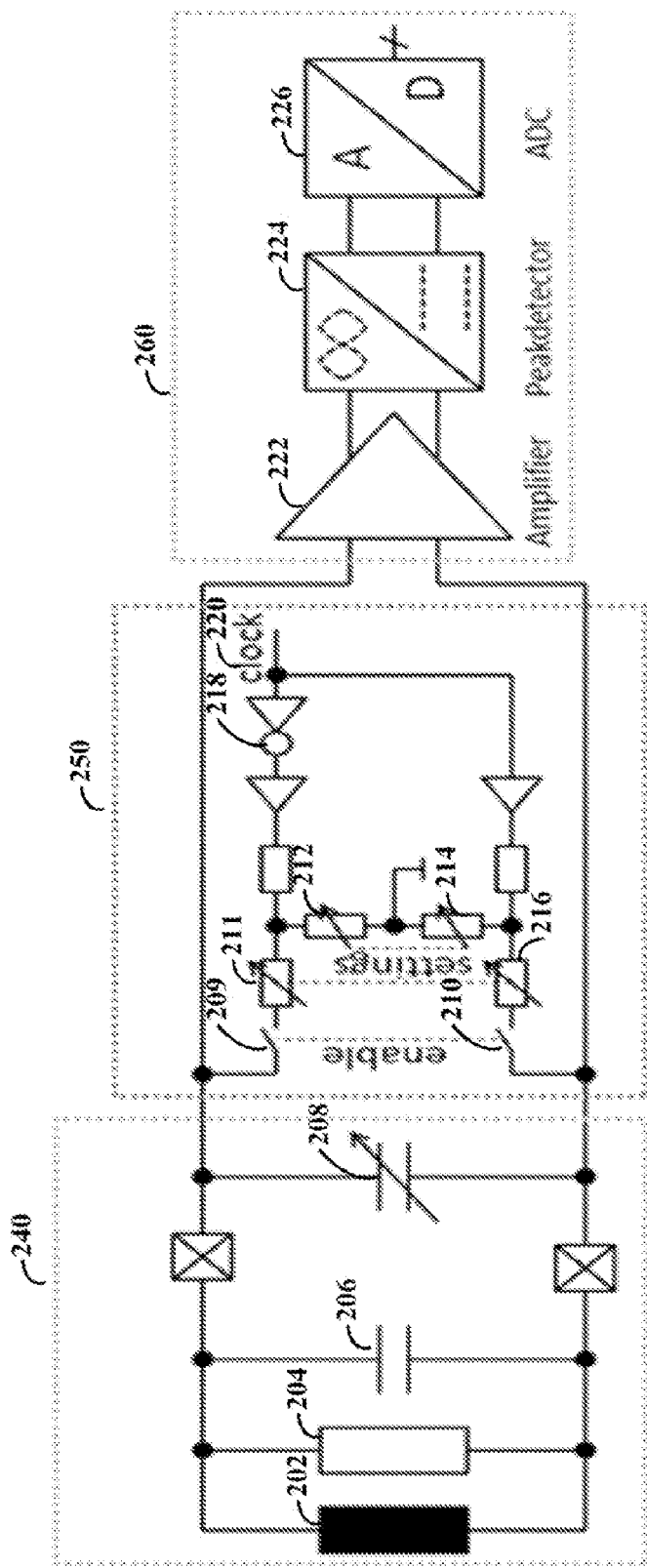
FIG. 2 depicts a circuit diagram from a resonant-based circuit, consistent with embodiments of the present disclosure.

FIG. 2 depicts a circuit diagram from a resonant-based circuit, consistent with embodiments of the present disclosure. Circuit block 240 includes a resonant circuit (e.g., an LC tank circuit) including inductor 202, resistor 204 and capacitor 206; however, other resonant circuits are possible such as an LC circuit. In certain instances, the resistor 204 can represent the finite internal resistance of the inductor 202. The impedance-related values for these components (particularly the inductive capacitive values) determine the resonant frequency of the circuit. Circuit block 240 also includes a trimming circuit, which is depicted as including a variable capacitor 208. This variable capacitor 208 is connected in parallel with the capacitor 206. This configuration represents a parallel resonant LC circuit. Accordingly, the capacitive value of the variable capacitor 208 also determines the resonant frequency for the resonant circuit.

As discussed herein, the exact values for these components can vary from device to device and can also vary over time (e.g., due to changes in temperature). Accordingly, circuit block 250 depicts a circuit configured and arranged to determine an impedance (capacitance) setting for variable capacitor 208. The circuit block 250 is configured to operate in one of two different modes. In the first mode, switches 209 and 210 couple and connect the driver circuit to the resonant circuit. When connected, the output of the resonant circuit is a function of a difference between the resonant frequency and a frequency of the signal provided by block 250. In the second mode, switches 209 and 210 disconnect and uncouple the driver circuit from the resonant circuit. This allows the resonant circuit to be used for other purposes, such as in RF communications.

The frequency provided by circuit block 250 can be determined from an external clock source (e.g., an external crystal oscillator). Accordingly, a relatively precise clock signal can be provided to the circuit block 250. The driver circuit is configured to convert a single ended signal (clock) 220 into a differential signal using an inverting buffer 218. The generated differential signal can then be provided to conditioned circuitry that can adjust the signal properties (e.g., amplitude and/or waveform).

For instance, the driver circuit can include series resistors 211 and 216. In certain embodiments, these series resistors 211 and 216 can be variable resistors. The values of these resistors can be set according to the circuit parameters. For instance, the series resistor 211 and 216 can be adjusted according to resistive and inductive properties of the resonant circuit (e.g., values can be set according to the resonant circuit quality factor (Q factor) of the resonant circuit). In some instances, this can be done at the manufacturing stage to allow a device manufacture to set the resistance values accordingly.

In another instance, the resistor divider network formed by resistors 212 and 214 can be adjusted. This adjustment can be particularly useful for controlling the amplitude of the signal driving the resonant circuit.

Aspects of the present disclosure are directed toward the use of a driver circuit that allows for the input clock signal to be provided as a square wave. A resonant circuit attenuates signals that are not at its resonance frequency. A square wave includes a number of different Fourier (harmonic) components. For example, a square wave having a fundamental frequency ω can be separated into its components:

$$V(t) = \frac{4V_0}{\pi}\left(\frac{\sin\omega t}{1} + \frac{\sin 3\omega t}{3} + \frac{\sin 5\omega t}{5} + \ldots\right).$$

Thus, contributions from the harmonics of the fundamental frequency for the square wave can result in varying amplitude peaks from these frequency components.

Circuit block 260 is configured to receive the output from the resonant circuit and to determine the peak amplitude values corresponding to different settings of the variable capacitor 208. The amplifier circuit 222 can be included to provide a signal in a desired range. For instance, the gain of the amplifier circuit 222 can be set to a value that prevents clipping or saturation of the ADC 226. Peak detector 224 can be configured to receive the amplified signal and provides an output signal that represents the peak amplitude for the oscillating signal. This output signal can then be provided to the ADC 226 to provide a digital output that can be used by a processing circuit to select a value for variable capacitor 208.

Figure 3:
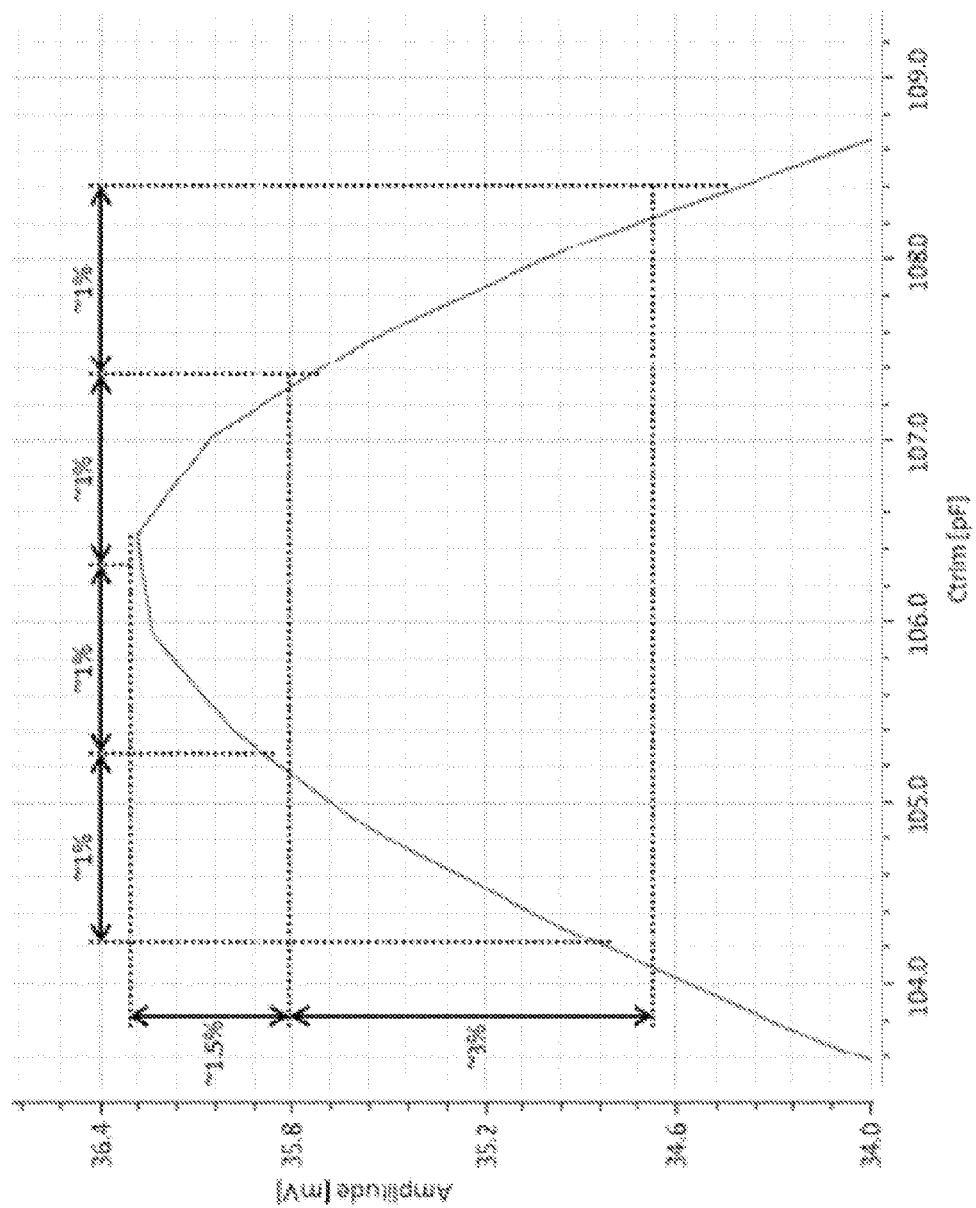
FIG. 3 depicts a graph of peak amplitude versus impedance, consistent with embodiments of the present disclosure.

FIG. 3 depicts a graph of peak amplitude versus impedance, consistent with embodiments of the present disclosure. The graph of FIG. 3 represents modeling of experimental embodiments and is not necessarily limiting. As shown in FIG. 3, there is an amplitude peak of about 36.3 mV at around 106.6 pF (the capacitance/impedance value for the trimming circuit). While this particular impedance value is relatively arbitrary, for a specific, non-limiting circuit, a similar graph can be obtained from a variety of different circuits and different component values. The graph shows that, for amplitudes near the peak value, the amplitude changes about 1.5% for a corresponding 1% change in the capacitance value. For a 2% change in the capacitance value, the corresponding change amplitude can be about 4.5%.

Aspects of the present disclosure are directed toward a processing circuit that is configured to operate in a trimming/calibration mode that is designed to account for inaccuracies in the measured amplitude (e.g., due to internal/external interference/noise). For instance, inaccuracies in measurements can result in the selection of a trimming impedance value that is outside of an acceptable accuracy range. Consistent with certain embodiments, such problems can be mitigated by taking additional measurements. These additional measurements can be averaged to lessen the impact of sporadic interference. Moreover, the processing circuit can be configured and arranged to discard one-off measurements. For instance, the processing circuit can be configured to exclude measurements that are significantly out of line with other measurements for similar impedance values. Particular embodiments are directed toward the use of smaller/finer impedance (capacitance) steps between amplitude measurements than would be necessary absent interference or other sources of measurement inaccuracies. This can include, for instance, multiple measurements for the same trimming impedance value. For instance, a trimming circuit can be designed to provide a set granularity of potential impedance steps (e.g., related to a number and size of capacitors in a switching capacitor circuit). The trimming/calibration mode can be configured to increment the capacitance steps at values smaller than the set granularity and thereby obtain additional measurements. The additional measurements can be used to mitigate noise, however, the trimming/calibration mode can thereby take longer to complete.

Figure 4:
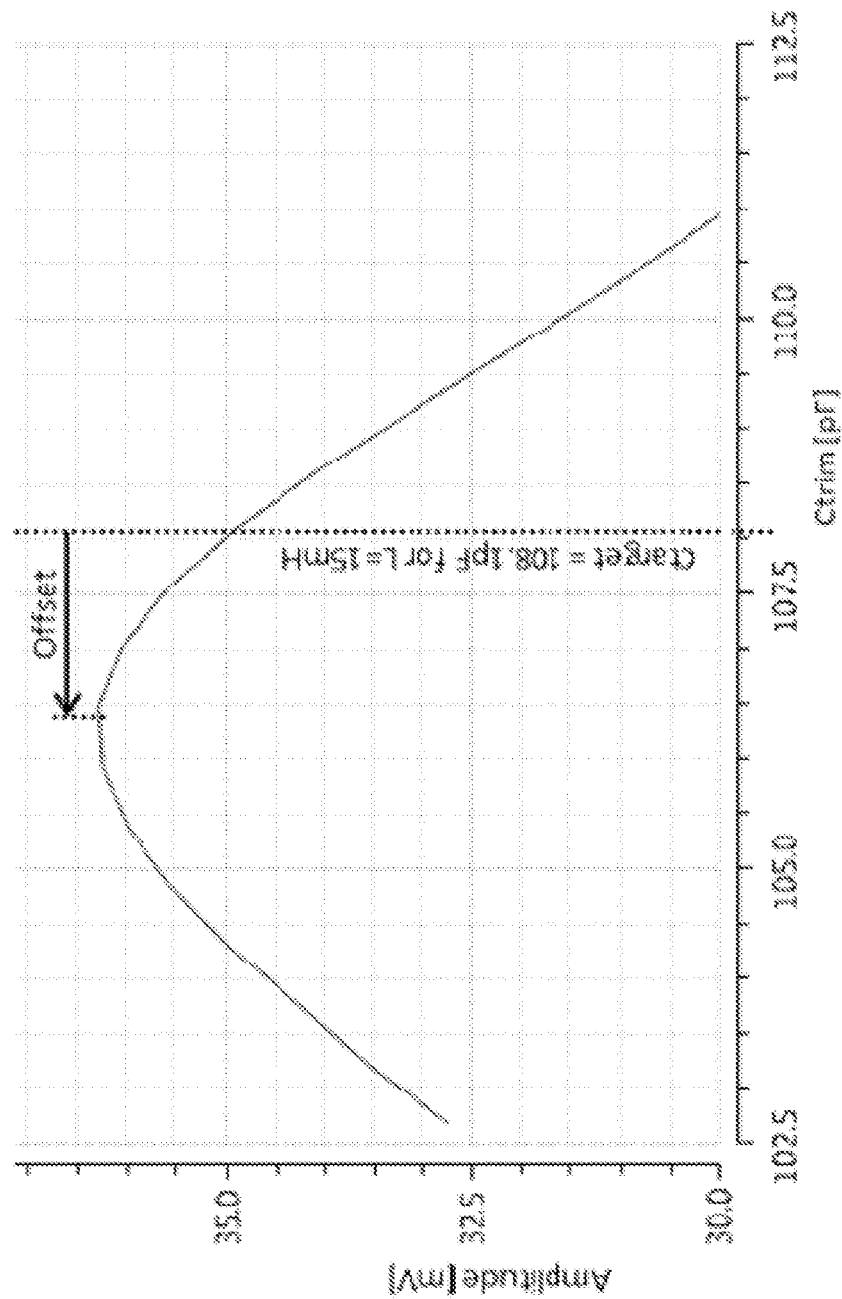
FIG. 4 depicts a graph of peak amplitudes versus impedance and an offset value, consistent with embodiments of the present disclosure.

FIG. 4 depicts a graph of peak amplitudes versus impedance and an offset value, consistent with embodiments of the present disclosure. Aspects of the present disclosure recognize that values measured during the trimming/calibration mode are not necessarily representative of the target impedance values during normal operation. For instance, the driver circuit can provide additional capacitance to the resonant circuit while connected during the trimming/calibration mode. Accordingly, and as depicted in FIG. 4, the processing circuit can be configured and arranged to introduce an impedance offset. FIG. 4 shows that for a particular, experimental embodiment, the offset is around 1 pF. Other offsets are also possible depending upon the specific circuit and related capacitance.

Various modules may be implemented to carry out one or more of the operations and activities described herein and/or shown in the Figures. In these contexts, a "module" is a circuit that carries out one or more of these or related operations/activities. For example, in certain of the above-discussed embodiments, one or more modules are discrete logic circuits or programmable logic circuits configured and arranged for implementing these operations/activities, as in the circuit modules shown in the Figures. In certain embodiments, the programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For instance, the trimming/calibration mode can be initiated in response to a variety of different events. Such modifications do not depart from the true spirit and scope of various aspects of the disclosure, including aspects set forth in the claims.

What is claimed is:

1. A device comprising:
   a resonant circuit configured and arranged to provide a peak current flow at a resonance frequency;
   a trimming circuit configured and arranged to provide a variable impedance to the resonant circuit and thereby change the resonance frequency;
   a driver circuit configured and arranged to generate a trimming signal that oscillates at a desired frequency, wherein the driver circuit is configured to generate the trimming signal at a frequency that matches a frequency of an input square wave signal;

a switch circuit configured and arranged to couple and decouple the driver circuit to the resonant circuit for driving the resonant circuit with the trimming signal;

an amplitude detection circuit configured and arranged to detect amplitudes for signals generated in response to the trimming signal being connected to the resonant circuit; and a processing circuit configured and arranged to correlate detected amplitudes from the amplitude detection circuit with different impedance values of the variable trimming circuit.

2. The device of claim 1, wherein the processing circuit is configured and arranged to generate a trim control signal and to provide the trim control signal to the trimming circuit to adjust the impedance value thereof.

3. The device of claim 1, further including a local clock oscillator circuit configured and arranged to generate the square wave signal that is provided to the driver circuit.

4. The device of claim 1, wherein the driver circuit is configured and arranged to generate the trimming signal by providing signal conditioning to the square wave signal to produce a sine wave signal.

5. The device of claim 1, wherein the resonant circuit is configured and arranged for use in a radio frequency communication device that receives radio frequency signals near the desired frequency and that is powered by a battery.

6. The device of claim 1, wherein the device is a passive radio frequency identification (RFID) device.

7. The device of claim 1, wherein the trimming circuit includes a variable capacitor circuit.

8. The device of claim 1, wherein the driver circuit includes a resistor divider network that includes one or more variable resistors that are configured and arranged to adjust an amplitude of the trimming signal as a function of a resistance setting.

9. The device of claim 1, wherein the driver circuit includes a series resistor circuit that includes one or more variable resistors that are configured and arranged for adjustment according to a quality factor for the resonant circuit.

10. The device of claim 1, wherein the driver circuit is configured and arranged to receive a single-ended clock signal and to produce a differential clock signal.

11. The device of claim 1, wherein the resonant circuit is a parallel LC circuit.

12. A method for trimming a radio frequency (RF) communication device, the method comprising:

providing an input signal that oscillates at a desired frequency to a trimming circuit that is configured to generate a trimming signal that has a oscillation frequency that is responsive to the desired frequency, wherein the trimming signal oscillate at a frequency that matches a frequency of an input square wave signal;

activating a switch circuit that is configured and arranged to couple and decouple the trimming signal to a resonant circuit that has a resonance frequency, wherein the coupling causes the trimming signal to drive the resonant circuit;

providing a control signal to a trimming circuit that is configured and arranged to respond to the control signal by providing a variable impedance to the resonant circuit and thereby change the resonance frequency;

detecting an amplitude for signals generated in response to the trimming signal being connected to the resonant circuit;

correlating the detected amplitudes with different impedance values of the variable trimming circuit; and determining an impedance value for the trimming circuit as a function of the correlated detected amplitudes and impedance values.

13. The method of claim 12, wherein the control signal corresponds to a capacitive value for the trimming circuit.

14. The method of claim 12, wherein the step of activating the switch circuit is responsive to power being provided to the RF communication device.

15. The method of claim 12, wherein the step of activating the switch circuit is responsive to a detected RF communication.

16. The method of claim 12, further including a step of generating the input signal from a crystal oscillator.

17. The method of claim 12, wherein the step of providing the control signal includes sweeping values of the control signal to effect variable impedance across a range of available impedance values for the trimming circuit.

18. The method of claim 12, wherein the step of determining the impedance value for the trimming circuit includes determining a peak amplitude value and a corresponding impedance value.

* * * * *